(12) United States Patent  
Kuyken et al.

(10) Patent No.: US 12,683,358 B2  
(45) Date of Patent: Jul. 14, 2026

(54) SEMICONDUCTOR MODE-LOCKED LASER DUAL COMB SYSTEM

(71) Applicants: UNIVERSITEIT GENT, Ghent (BE); IMEC VZW, Leuven (BE)

(72) Inventors: Bart Kuyken, Ghent (BE); Kasper Van Gasse, Ghent (BE)

(73) Assignees: UNIVERSITEIT GENT, Ghent (BE); IMEC VZQ, Leuven (BE)

( * ) Notice: Subject to any disclaimer, the term of this patent is extended or adjusted under 35 U.S.C. 154(b) by 890 days.

(21) Appl. No.: 17/923,514

(22) PCT Filed: May 7, 2021

(86) PCT No.: PCT/EP2021/062211  
§ 371 (c)(1),  
(2) Date: Nov. 4, 2022

(87) PCT Pub. No.: WO2021/224485  
PCT Pub. Date: Nov. 11, 2021

(65) Prior Publication Data  
US 2023/0208101 A1 Jun. 29, 2023

(30) Foreign Application Priority Data  
May 8, 2020 (EP) ..................................... 20173752

(51) Int. Cl.  
*H01S 5/40* (2006.01)  
*G01J 3/10* (2006.01)  
(Continued)

(52) U.S. Cl.  
CPC .............. *H01S 5/0657* (2013.01); *G01J 3/10* (2013.01); *G01J 3/45* (2013.01); *H01S 5/0078* (2013.01);  
(Continued)

(58) Field of Classification Search  
CPC .............................. H01S 5/4006; H01S 5/0657  
See application file for complete search history.

(56) References Cited

U.S. PATENT DOCUMENTS 4,635,246 A * 1/1987 Taylor ................... H01S 5/4006  
372/18  
4,807,953 A * 2/1989 Smith ..................... H01S 3/302  
385/27  
(Continued)

FOREIGN PATENT DOCUMENTS

| | | |
|---|---|---|
| CN | 104409956 A | 3/2015 |
| WO | 2018159445 A1 | 9/2018 |

OTHER PUBLICATIONS

Keyvaninia et al. (Narrow-linewidth short-pulse III-V-on-Silicon mode-locked lasers based on a linear and ring cavity geometry; Optics Express, vol. 23, No. 3, Feb. 2015) (Year: 2015).*  
(Continued)

*Primary Examiner* — Tod T Van Roy  
(74) *Attorney, Agent, or Firm* — Workman Nydegger

(57) ABSTRACT

A photonic integrated circuit-based dual frequency comb source, an integrated system for dual comb spectroscopy and corresponding method are disclosed. The dual comb source includes, on a same substrate of the photonic integrated circuit, a first and second semiconductor integrated mode-locked laser, a master laser, and connection arrangement between the master laser and each of the first and second mode-locked laser. The master laser is configured for generating a lasing line for simultaneous optical injection-locking of the first and second mode-locked laser, the first and second mode-locked laser are configured for generating a first and second frequency comb respectively, and the connection arrangement is suitable for coherently transferring lasing light from the master laser to each mode-locked laser. The mode-locked lasers include a gain section and a (Continued)

saturable absorber section to provide mode-locking, and an extended optical cavity formed in the substrate.

20 Claims, 3 Drawing Sheets

(51) Int. Cl.

| | |
|---|---|
| *G01J 3/45* | (2006.01) |
| *H01S 5/00* | (2006.01) |
| *H01S 5/02* | (2006.01) |
| *H01S 5/042* | (2006.01) |
| *H01S 5/065* | (2006.01) |
| *H01S 5/10* | (2021.01) |
| *H01S 5/14* | (2006.01) |
| *H01S 5/343* | (2006.01) |

(52) U.S. Cl.
CPC .............. *H01S 5/021* (2013.01); *H01S 5/042* (2013.01); *H01S 5/1025* (2013.01); *H01S 5/14* (2013.01); *H01S 5/3434* (2013.01); *H01S 5/3438* (2013.01); *H01S 5/4006* (2013.01); *G01J 2003/102* (2013.01)

(56) References Cited

U.S. PATENT DOCUMENTS

| | | | | |
|---|---|---|---|---|
| 5,379,309 | A * | 1/1995 | Logan, Jr. ............. | H01S 5/4006 372/18 |
| 11,112,310 | B2 * | 9/2021 | Anandarajah ........... | G01J 3/427 |
| 11,719,634 | B2 * | 8/2023 | Meyer ................... | H01S 5/3422 356/328 |
| 12,015,238 | B2 * | 6/2024 | Maker ................... | H01S 3/2383 |
| 12,212,112 | B2 * | 1/2025 | Nakamura .............. | G02F 1/025 |
| 2011/0304853 | A1 * | 12/2011 | Yamada ................... | H01S 5/14 372/20 |
| 2014/0153600 | A1 | 6/2014 | Luo et al. | |
| 2020/0109988 | A1 * | 4/2020 | Sterczewski ........... | G01N 21/45 |
| 2021/0036484 | A1 * | 2/2021 | Maker ................... | H01S 3/1305 |
| 2023/0208101 | A1 * | 6/2023 | Kuyken ................ | H01S 5/1025 356/326 |
| 2026/0066610 | A1 * | 3/2026 | Liu ........................... | G02F 2/02 |

OTHER PUBLICATIONS

Van Gasse et al. (III-V-on-silicon mode-locked laser with 1-GHz line spacing for dual-comb spectroscopy, CLEO, Optical Society of America, 2020) (Year: 2020).*

Van Gasse et al. (Dual-comb spectroscopy with two on-chip III-V-on-silicon 1-Ghz mode-locked laser, CLEO, Optical Society of America, 2021) (Year: 2021).*

Pinkert et al., "Frequency Comb Generation by CW Laser Injection into a Quantum-Dot Mode-Locked Laser," Optics Express, vol. 20, No. 19, Sep. 4, 2012, 15 pages.

Uvin et al., "Narrow Line Width Frequency Comb Source Based on an Injection-Locked III-V-on-Silicon Mode-Locked Laser," Optics Express, vol. 24, No. 5, Mar. 2, 2016, 10 pages.

Shen et al., "High-Bandwidth Uni-Traveling Carrier Waveguide Photodetector on an InP-Membrane-on-Silicon Platform," Optics Express vol. 24, No. 8, Apr. 8, 2016, 12 pages.

Suh et al., "Microresonator Soliton Dual-Comb Spectroscopy," Science, vol. 354, Issue 6312, Nov. 4, 2016, pp. 600-603.

Van Gasse et al., "An On-Chip III-V-Semiconductor-on-Silicon Laser Frequency Comb for Gas-Phase Molecular Spectroscopy in Real-Time," arXiv: Optics, Cornell University Library, Jun. 26, 2020, 17 pages.

Search Report from corresponding European Application No. 20173752. 5, Oct. 12, 2020.

International Search Report from PCT Application No. PCT/EP2021/ 062211, Jul. 30, 2021.

Lo, Mu-Chieh et al., "Monolithically Integrated On-Chip Dual Mode-Locked Lasers in InP-Based Generic Foundry Platform", 2019 Conference on Lasers and Electro-Optics Europe & European Quantum Electronics Conference (CLEO/ Europe-EQEC), as early as Jun. 23, 2019, 1 page.

Roelkens, G et al., "III-V-on-silicon photonic integrated circuits for communication and sensing applications", 2015 IEEE Photonics Conference (IPC), as early as Oct. 4, 2015, pp. 593-594.

Japanese Office Action from Corresponding Japanese Patent Application No. JP2022-567592, Nov. 26, 2024.

* cited by examiner

SEMICONDUCTOR MODE-LOCKED LASER DUAL COMB SYSTEM

FIELD OF THE INVENTION

The present invention relates to optical frequency comb generators and frequency comb spectroscopy. More specifically, it relates to optical dual frequency comb generators based on integrated semiconductor mode-locked lasers.

BACKGROUND OF THE INVENTION

Frequency comb generation based on mode-locked semiconductor lasers has long been known in the art. However, the short cavities of integrated semiconductors practically limits pulse repetition rates of those lasers to tens of gigahertz. This is too wide for dense spectroscopy applications such as gas absorption spectroscopy, which requires gigahertz repetition rates, or below, to accurately resolve the spectral absorption features under atmospheric pressure.

Silica wedge microresonators on a silicon chip have been proposed by Suh et al. "Microresonator soliton dual-comb spectroscopy", Science (6312), 600-603, November 2016, as one possible source of two frequency combs based on soliton generation in Kerr cavities. However, these microresonators require precise alignment to fiber tapers to couple in the strong light of two external cw fiber lasers. This makes this approach difficult to operate and hundreds of milliwatts of on-chip optical power are required. The comb line spacing of about 22 GHz is still too wide for dense spectroscopy applications such as gas absorption spectroscopy, requiring gigahertz repetition rates, or below. The dual comb spectroscopy measurements based on the silica wedge microresonators have limited frequency resolution which is caused by the limited mutual coherence of the two external fiber lasers.

Therefore, there is still a need for mutually coherent dual frequency comb sources that can be integrated onto a single substrate.

SUMMARY OF THE INVENTION

It is an object of embodiments of the present invention to provide a mutually coherent dual frequency comb source that can be integrated onto a single substrate.

It is a further object of embodiments of the present invention to provide a mutually coherent dual frequency comb source that does not require phase-tuning of the optical resonators for achieving mutual coherence.

The above objective is accomplished by a method and devices according to the present invention.

In a first aspect, the invention relates to a photonic integrated circuit-based mutually coherent dual frequency comb source which comprises, on a same substrate of the photonic integrated circuit, a first and a second semiconductor integrated mode-locked laser for generating a first and second frequency comb respectively, a master laser for generating a continuous wave (cw) lasing line for simultaneous optical injection-locking of the first and second mode-locked laser, and connection arrangement that is interposed between an output port of the master laser and a respective input port of each of the first and second mode-locked laser, for coherently transferring lasing light generated by the master laser to each mode-locked laser. Each of the first and second mode-locked laser includes a gain section and a saturable absorber section to provide mode-locking. At least the gain sections are provided as heterogeneously integrated III-V material layer stacks, which are bonded to the substrate. Furthermore, the first and second mode-locked laser each include an extended optical cavity that contains a passive waveguide structure formed in a waveguide layer of the substrate. At least the resonant mode of each extended optical cavity that is frequency-locked to the continuous wave laser line upon injection into that extended optical cavity has a spectral bandwidth below 5 MHz at 5 µs integration time, preferably below 3 MHz at 5 µs integration time, e.g. below 1 MHz at 5 µs integration time, and the master laser is configured to generate the cw lasing line with a linewidth narrower than a frequency spacing between modes of the first and second frequency comb, thereby allowing reliable, mutually phase-coherent injection-locking of the first and second frequency comb with respect to the cw lasing line emitted by the master laser.

The lasing line generated by the master laser efficiently stabilizes the carrier offset frequencies of both the first and second mode-locked laser, by optically injection-locking to the master lasing line one of the comb lines of each one of the first and second generated frequency comb. As a result of the optical injection lock and the coherence between comb lines characteristic of a frequency comb, the low-noise and stable phase coherence properties of the master laser are mutually transferred to the plurality of comb lines spanning the generated first and second frequency comb. A coherent transfer of lasing light generated by the master laser to each mode-locked laser preserves the phase coherency between the two light waves that are injected into the two mode-locked lasers for injection-locking. As a result, the first and second generated frequency combs are mutually coherent, i.e. each comb line of the first frequency comb is coherent with each other comb line of the first frequency comb and each comb line of the second frequency comb, and vice versa. Moreover, the comb lines of the first and second frequency comb are also coherent with respect to the continuous wave lasing line generated by the master laser and notably can be made tunable via the cw lasing line of the master laser. The provision of the dual frequency comb source as a photonic integrated circuit warrants the high degree of phase coherence and long-term stability required for dual comb spectroscopy applications, e.g. the mutual coherence of the two frequency combs is preserved in the presence of external mechanical disturbances (e.g. vibrations), thermal disturbances (e.g. temperature fluctuations), etc., and for time spans sufficiently long to conduct dual frequency comb spectroscopy. Coherence times of about 100 µs or longer can thus be ensured in embodiments of the invention.

According to preferred embodiments of the invention, the passive waveguide structures of the mode-locked laser extended optical cavities comprise a wide bandgap material that is optically transmissive over a large spectral bandwidth. This has the advantage that low intracavity losses, including linear and nonlinear absorption losses, can be obtained in a wide spectral range circumscribed by the generated frequency combs. Therefore, higher pulse energies can be produced by the mode-locked lasers and shorter gain sections may be provided in the mode-locked lasers, lowering the noise contribution of amplified spontaneous emission. A low chromatic dispersion of the wide bandgap material allows for reduced pulse broadening in the optical cavity, which is beneficial for achieving very short optical pulses and broad frequency combs. The wide bandgap material may be a dielectric material.

According to embodiments of the invention, the extended optical cavity of each of the first and second mode-locked laser may be arranged as a linear optical resonator or as a ring resonator. Ring resonators have the advantage that no mirrors for optical feedback have to be provided and therefore, no dispersion contributions of such mirrors are present in ring resonators. In contrast thereto, linear resonators are not affected by bidirectional pulsed lasing, harnessing of which requires more sophisticated laser implementations, and end mirrors in the linear resonators can be used to limit the optical bandwidth.

According to embodiments of the invention, the connection arrangement may comprise a coupling element in optical communication with the output port of the master laser and at least two delivery waveguides optically connected between the coupling element and the input ports of the first and second mode-locked laser. Coupling into at least two distinct delivery waveguides has the advantage that further optical components can be inserted into each delivery waveguide which allow the lasing line for injection locking to be manipulated individually with respect to each one of the first and second mode-locked laser.

According to embodiments of the invention, each one of the first and second mode-locked laser may comprise a gain section adapted for electrical pumping and a saturable absorber section.

The gain section and the saturable absorber section of at least one of the first and second mode-locked laser can be made from a different semiconductor material or from a same semiconductor material. If made from the same semiconductor material, the arrangement and/or size of layers in the stack may be different for the gain section and the saturable absorber section, or may be identical.

According to embodiments of the invention, the gain sections of the first and second mode-locked laser may be heterogeneously integrated onto the substrate. Especially III-V on silicon-on-insulator (SOI) or insulator-on-insulator heterogenous integration are established and versatile photonics platforms for which the benefits of a combination of low-loss waveguiding capabilities with efficient gain materials bonded onto the photonic integrated circuit (PIC) has been experimentally validated.

According to embodiments of the invention, the connection arrangement may further comprise a frequency shifter arranged between the output port of the master laser and the input port of only one of the first and second mode-locked laser. This has the advantage that aliasing effects in the beat notes of an acquired interferogram can be reduced and/or that the two mutually coherent frequency combs can be locked on a comb line in the center portion of the combs. Aliasing is generally caused by residual comb lines spaced to the left or right of the optically injection-locked comb line located at the short wavelength or long wavelength end of the frequency comb respectively. These residual comb lines are in general located outside the useable optical bandwidth, e.g. the 3 dB bandwidth, but may still have non-negligible strength.

According to embodiments of the invention, the connection arrangement may be devoid of any optical isolator, including optical isolators that are part of the master laser (e.g. arranged at output port). It is an advantage of not having to provide an optical isolator which is difficult to achieve on-chip in a CMOS compatible manufacturing process. Therefore, embodiments of the invention allow compact, cost-efficient and mechanically stable PICs without moving parts to be produced at large scales, for instance in a wafer-scale process, e.g. a CMOS compatible process.

According to embodiments of the invention, the connection arrangement may further comprise at least one optical attenuator to control an amount of optical power that is injected into each of the first and second mode-locked laser. The presence of an optical attenuator is beneficial because it allows the injection of low optical powers into the optical cavities of the first and second mode-locked laser relative to an optical power of the lasing line as emitted by the master laser, for the purpose of injection locking. Operating the master laser at larger output powers has the advantage that stable, low-noise and narrow linewidths can be obtained for reliable injection locking. Furthermore, the attenuator efficiently protects the master laser from disturbing optical feedback.

According to embodiments of the invention, at least one of the first and second mode-locked laser may configured for generating a frequency comb with less than 10 GHz comb spacing, such as mode spacings of the frequency comb between 100 MHz and 10 GHz. This has the advantage that dual frequency comb spectroscopy can be performed in the gas phase at atmospheric pressure, for which collisional broadening of rovibrational absorption lines lies in the gigahertz region, and which is not limited by undersampling constraints (ambiguities caused by undersampling). Compared to the approach of using interleaved spectra, embodiments of the present invention allow for a more precise determination of absorption line parameters and enable time-resolved spectroscopy applications. An RF linewidth associated with the comb lines in the RF domain may be below 500 kHz across the entire frequency comb.

In a further aspect, the present invention relates to an integrated system for dual frequency comb spectroscopy, which comprises a photonic integrated circuit-based dual frequency comb source according to embodiment of the first aspect and a photodetector that is arranged to receive the combined frequency combs of the first and second mode-locked laser. Besides, a sensing area is provided in a light path extending between only one of the first and second mode-locked laser and the photodetector. The sensing area is configured for allowing light-matter interaction between a generated frequency comb and a species to be sensed, and a difference in comb spacing of the generated first and second frequency comb is comprised in a detectable radiofrequency range of the photodetector.

The sensing area may comprise a waveguide portion that is configured for evanescent wave sensing between the generated frequency comb, when guided by this waveguide portion, and the species to be sensed. Curvilinear waveguides for evanescent sensing can be densely curled up to only use a limited amount of surface area of a photonic integrated circuit and yet provide relatively long interaction lengths. The dual frequency comb spectroscopy system may further comprise processing means for detecting and analyzing beat lines in an interferogram produced by the photodetector, in response to interference of received first and second frequency combs. Further, the system may be provided as a photonic integrated circuit.

In yet another aspect, the present invention relates to a method of performing dual frequency comb spectroscopy on a sample comprising a species to be sensed. The method comprises the steps of providing a photonic integrated circuit-based dual frequency comb source according to embodiment of the first aspect, wherein a repetition rate of a first generated frequency comb differs from a repetition rate of a second generated frequency comb. In another method step, the lasing light that is generated by the master laser is coherently transferred from an output port of the master laser to a respective input port of each of the first and second mode-locked laser, thereby injection locking the first and second mode-locked laser to a wavelength of the lasing light. In a further step, the first generated frequency combs is directed through a sensing area, which is configured for receiving the species to be sensed and for allowing light-matter interaction between the frequency comb and the species. The method also includes contacting the sample with the sensing area and detecting beat notes in an interferogram generated upon superimposition of the first and second generated frequency comb on a photodetector, wherein the first generated frequency comb has interacted with the species in the sample.

It is a further advantage of some embodiments of the invention that the mode-locked lasers can be passively mode-locked, which leads to simpler laser design and operation because no active RF modulation is needed. This also allows power to be saved. In other embodiments of the invention the mode-locked lasers are adapted for hybrid mode-locking, which has the additional advantage that the repetition rates of the two generated frequency combs can be stabilized even at low RF powers. Hybrid mode-locking of the mode-locked lasers has the further advantage that the repetition rates of the first and second generated frequency comb can be referenced to a high-quality frequency standard, for instance a transition in a maser or cesium clock, which allows dual frequency comb spectroscopy to be conducted at very high frequency resolution.

It is a further advantage of some embodiments of the invention that a wide and dense frequency comb spectrum can be obtained, comprising more than 1000 lines at relatively small comb line spacing below 10 GHz, e.g. at about 1 GHz. Frequency combs may have an optical bandwidth exceeding 1 THz in the near-infrared, which enables accurate and high-resolution broadband gas phase spectroscopy.

It is a further advantage of some embodiments of the invention that the mutually coherent dual frequency comb sources for spectroscopy do not rely on frequency-tuning of the comb lines or multiple scanning in order to obtain a complete acquisition of a spectroscopic line or band. Sequential scans may be necessary in other dual comb approaches which provide only a small number of comb lines, e.g. tens to a few hundred comb lines, and/or for which the difference in repetition rates is too high, and/or for which the repetition rate is too high. It is a therefore a further advantage of some embodiments of the invention that dual comb spectroscopy can be performed without scanning elements and that real-time multiplexed spectroscopy is enabled. A single acquisitions of a broadband spectroscopic line or band is thus a matter of microseconds, allowing for more accurate measurements by accumulating and averaging over multiple scans in a millisecond long time spans.

It is a further advantage of some embodiments of the invention that the optical gain provided on-chip provides sufficiently strong pulse peak powers that allow long interaction lengths in a gas sample, e.g. tens of meters to a few hundred meter long absorption paths in the gas sample.

It is a further advantage of some embodiments of the invention that injection locking is obtained on-chip, not requiring any external feedback loop for stabilization.

It is a further advantage of some embodiments of the invention that the generation of the two mutually coherent frequency combs does not rely on external high-power laser (e.g. of the order of watts) which are unfit for photonic integration.

It is a further advantage of some embodiments of the invention that the generation of the two mutually coherent frequency combs only requires little electrical power, e.g. a few hundreds of milliwatts, e.g. about 100 mW, which allows the dual comb source to be battery-powered.

It is a further advantage of some embodiments of the invention that the optical injection-locking of the generated frequency combs to a narrow linewidth master laser ensures good mutual coherence of the two combs. It is a further advantage of some embodiments of the invention that also good thermal and mechanical stability is obtained because the absolute frequency positions of the generated and locked combs drift according to the frequency shift experienced by the lasing line for injection locking, generated by the master laser on the same substrate.

It is a further advantage of some embodiments of the invention that a flat-top comb spectrum and good sensitivity (e.g. good signal-to-noise ratio of the RF fundamental beat note) are obtained as compared to frequency comb generators which are missing comb lines, comprise too few or too sparsely distributed lines, or which lack a good signal-to-noise ratio.

It is a further advantage of some embodiments of the invention that no separate parts like external cavity mirrors or external saturable absorber mirrors are required, thus avoiding any alignment and coupling issues with respect to those parts. In particular, no external high-quality optical cavity is needed to obtain a narrow comb line spacing, e.g. below ten gigahertz.

It is a further advantage of some embodiments of the invention that only a single photodetector is needed to perform dual comb spectroscopy.

It is a further advantage of some embodiments of the invention that the extended optical cavities of the mode-locked lasers are arranged according to an anti-colliding pulse configuration, which allows higher pulse peak powers to be obtained at the output of the source, and/or which allows for reduced timing jitter in the pulse trains generated by the mode-locked lasers. Anti-colliding pulse configuration or topology means that there is only one pulse circulating in the mode-locked laser cavity so that during one roundtrip the cavity is traversed twice. Besides, the anti-colliding pulse configuration allows to amplify the lasing line for injection locking, when injected into the optical cavities via the first (rear) reflector instead of the second (front) reflector.

Particular and preferred aspects of the invention are set out in the accompanying independent and dependent claims. Features from the dependent claims may be combined with features of the independent claims and with features of other dependent claims as appropriate and not merely as explicitly set out in the claims.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, in which.

Figure 1:
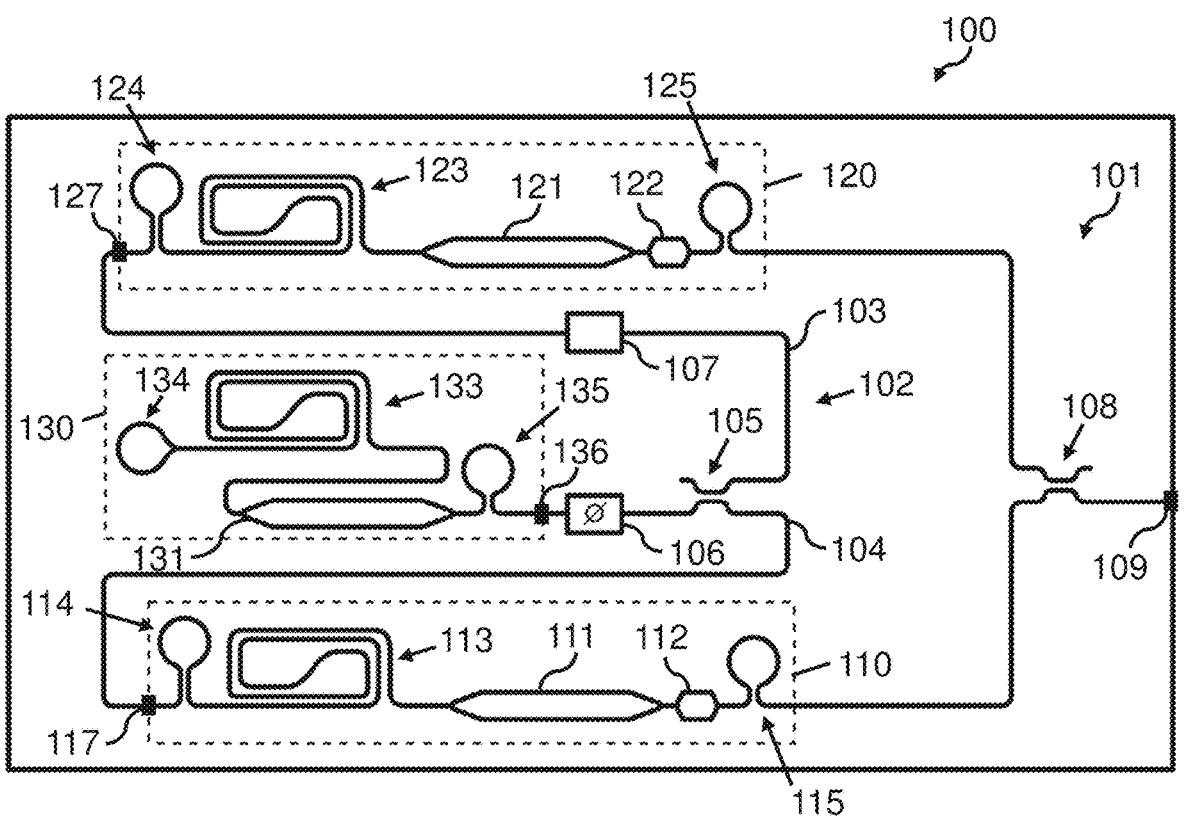
FIG. 1 shows a dual frequency comb source provided as a photonic integrated circuit, in accordance with a first embodiment of the invention, in which a combination of two mutually coherent frequency combs is supplied by an output of the source.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art.

In the description provided herein, numerous specific details are set forth. However, it is understood that embodiments of the invention may be practiced without these specific details. In other instances, well-known methods, structures and techniques have not been shown in detail in order not to obscure an understanding of this description.

Definitions

When in the present disclosure reference is made to a mode-locked laser, what is meant is that the laser is operated in the mode-locked regime to emit a regular pulse train at the laser's pulse repetition rate. The optical output spectrum of the pulse train generated by a mode-locked laser comprises a plurality of equidistantly spaced lines—a frequency comb with line spacing at the repetition rate $f_{rep}$. For the mode-locked laser a fixed phase relationship is established between the equidistant lines of the frequency comb, which are related to longitudinal modes of the laser resonator; the mode-locked laser thus generates a frequency comb the lines of which are mutually coherent. Moreover, the subsequent pulses of the generated pulse train are also mutually coherent, apart from a constant phase shift—the carrier envelope offset frequency $f_{CEO}$. As a result, a frequency comb is defined by a collection of discrete lines in the optical output spectrum of the mode-locked laser which spectral locations obey the equation $f = f_{CEO} + n \ast f_{rep}$, wherein n is a positive integer. Thus knowing the two independent degrees of freedom of the frequency comb, the two frequencies $f_{CEO}$ and $f_{rep}$, all frequencies of the comb are well-defined.

When in the present disclosure reference is made to passive mode-locking, what is meant is a mode-locking technique applied to lasers comprising an intensity-dependent transmission element such as a saturable absorber in a semiconductor laser. The intensity-dependent transmission element is capable of rapidly modulating the intracavity losses at the timescale of a single circulating pulse without requiring any externally supplied modulation signal. This is in contrast to active mode-locking techniques which rely on an actively driven optical modulator that is placed into the laser resonator.

When in the present disclosure reference is made to hybrid mode-locking, what is meant is a stabilization technique applied to passively mode-locked semiconductor lasers, which works by electrical injection of a radiofrequency (RF) signal, modulated at the pulse repetition rate of the mode-locked semiconductor laser. The gain and/or the saturable absorber of the semiconductor laser can be modulated by such an RF signal. Hybrid mode-locking stabilizes the repetition rate of the semiconductor laser and often reduces phase noise and timing jitter.

When in the present disclosure reference is made to heterogenous integration, this relates to the process of assembling separately manufactured components into a higher-level aggregate with enhanced functionality and improved operating characteristics.

When in the present disclosure reference is made to an integrated dual frequency comb source, what is meant is a dual frequency comb source that is provided as a photonic integrated circuit, i.e. a photonic integrated circuit-based dual frequency comb source. The photonic integrated circuit is typically provided as a photonic chip and the photonic integrated circuit-based dual frequency comb source then constitutes an on-chip dual frequency comb.

FIG. 1 shows an integrated dual frequency comb source 100 according to a first embodiment of the invention, which may be provided as a photonic integrated circuit (PIC). The dual frequency comb source 100 comprises, on a same substrate 101, a first integrated semiconductor mode-locked laser 110, a second integrated semiconductor mode-locked laser 120, and a master laser 130. Each of the first and second mode-locked laser 110, 120 comprises a gain section 111, 121 and a saturable absorber section 112, 122 electrically separated from the gain section, e.g. by virtue of a deep-etched insulation trench. An electrical separation of the saturable absorber section from the gain section can also be obtained by providing a saturable absorber section that is mechanically separated from the gain section. Further, an extended optical cavity 113, 123 of each mode-locked laser is optically coupled to the corresponding gain section 111, 121 and corresponding saturable absorber section 112, 122. Preferably, the first and second semiconductor mode-locked lasers 110, 120 have similar designs so that, once manufactured, their properties, such as noise characteristics, thermal response, lasing thresholds, are closely matched. A similar design may relate, but is not limited, to similar geometric configurations of the extended cavities, similar or equal materials used to implement the extended optical cavities, similar or equal materials used to implement the gain sections, similar or equal materials used to implement the absorber sections, similar or equal materials used to attach the gain sections and/or the absorber sections onto the same substrate (e.g. by adhesive bonding). This similarity in design is also practical from a fabrication point of view because it allows the two mode-locked lasers to be processed simultaneously, or at least shortly one after another in a single processing step, which may be a wafer-scale process. For instance, adhesive die-to-wafer bonding or transfer printing may be used to attach gain sections and/or the absorber sections onto the same substrate. A length of the extended optical cavity 113, 123 of each mode-locked laser 110, 120, however, can be made to slightly differ by a few percent, thus resulting in two mode-locked lasers with slightly differing frequency comb line spacing (repetition rate). The master laser 130 is optically coupled to both the first mode-locked laser 110 and the second mode-locked laser 120 such that light generated by the master laser 130 is delivered and injected into each of the two mode-locked lasers 110, 120. More specifically, the light generated by the master laser 130 is injected into the respective optical cavity (standing-wave resonator) 113, 123 of each of the first and second mode-locked laser. In the present embodiment, an output port 136 of the master laser 130 is in optical communication with corresponding input ports 117, 127 of the first and second mode-locked laser 110, 120 respectively, e.g. via a connection arrangement 102 on the substrate 101 which comprises light paths that extend between the output port 136 of the master laser 130 and the input ports 117, 127 of the mode-locked lasers 110, 120. Such a connection arrangement 102 preferably comprises waveguides 103, 104 for directing light from the output port of the master laser to the corresponding input ports of the mode-locked lasers.

Each of the gain sections 111, 121 comprises a semiconductor gain medium and is adapted for electrical pumping by forward current injection. The gain sections 111, 121 may comprise an epitaxial III-V material layer stack that is bonded onto the substrate 101, e.g. by adhesively attaching the material layer stack with a benzocyclobutene (BCB) attachment layer in a die-to-wafer bonding process, or by molecularly bonding of the material layer stack onto the substrate. The substrate 101 may be a silicon-on-insulator substrate (SOI), a semiconductor substrate, e.g. silicon, germanium or silicon carbide, or an insulator-on-insulator substrate, e.g. silicon nitride on silica. As a result, the photonic integrated circuit-based dual frequency comb source is provided as a heterogeneously integrated PIC. A typical III-V material layer stack may be manufactured in an InP technology and may comprise layers of ternary and quaternary compositions of InP for vertical optical mode confinement and charge carrier confinement. A ridge may be formed in the III-V material layer stack by etching of the top layers to achieve lateral optical mode confinement. For instance, an active layer for light emission by carrier recombination may comprise one or more InGaAsP quantum wells, flanked by InP barriers. Alternatively, an active layer of the III-V material layer stack may comprise quantum dot or quantum dash interlayers. The gain sections 111, 121 may have a longitudinal extent of several hundred micrometers, e.g. between 200 µm and 4000 µm, e.g. between 400 µm and 1600 µm, depending on the material gain and the forward current used for electrical pumping.

Each of the saturable absorber sections 112, 122 may comprise a nonlinearly absorbing medium, e.g. a semiconductor absorption medium, or an artificial saturable absorber, e.g. a nonlinear waveguide interferometer or nonlinear waveguide loop mirror. A semiconductor absorption medium may be the same as the unpumped gain medium of the gain section, e.g. may comprise the same epitaxial III-V material layer stack as the gain section, heterogeneously integrated onto the substrate 101, e.g. by adhesive bonding, molecular bonding, or transfer-printing. Besides, each of the saturable absorber sections 112, 122 that comprises a semiconductor medium is adapted for application of a reverse DC bias voltage, or a reverse DC bias voltage combined with an RF signal, modulated at the pulse repetition rate of the respective mode-locked laser 110, 120, across the saturable absorber section, e.g. for obtaining faster recovery and/or repetition rate stabilization by hybrid mode-locking.

The longitudinal extent of semiconductor-based saturable absorber sections 112, 122 is typically only a fraction of the longitudinal extent of the respective gain section 111, 121, e.g. a tenth or less, e.g. 10 μm to 400 μm, e.g. between 10 μm and 100 μm. However, embodiments are not limited to identical epitaxial layer stacks, and absorption media in general, for the gain and saturable absorber sections in each mode-locked laser. For instance, the saturable absorber section may comprise a portion of the extended optical cavity that is implemented as a waveguide with in-diffused absorbing dopant ions or a cladding layer including quantum dot material. In comparison to the gain section, a medium or epitaxial layer stack of lower saturation fluence, and/or shorter recovery time, and/or reduced multi-photon absorption losses may be selected for the saturable absorber section to further improve pulse steepening, and/or reduce cavity losses. Embodiments of the invention in which the gain and saturable absorber section of the mode-locked laser are formed in the same substrate-bonded epitaxial III-V material layer stack have the advantage that a contiguous and uniform active waveguide can be defined in the active region of the layer stack, which offers good modal gain and reduced cavity losses in the absence of additional spot-converters/ vertical tapers. Additionally, the substrate-bonded epitaxial III-V material layer stack, when manufactured in a multistep epitaxial growth process, can contain different epitaxial layer structures on a same die and has the benefit that different active waveguide cross-sections can be defined for the gain sections and the saturable absorber sections, respectively. For instance, the active waveguide cross-section in the saturable absorber section may be reduced, relative to the waveguide cross-section in the gain section, to obtain higher index-confinement of the guided optical mode in the active area and thereby also lower saturation powers. Another possibility is to provide saturable absorber section that correspond to substrate-bonded membrane-type III-V material layer stacks, similar to those known in the field of uni-traveling carrier (UTC) waveguide photodetectors, e.g. a III-V material layer stack with cross-section as described in section two of L. Shen, Y. Jiao, W. Yao, Z. Cao, J. van Engelen, G. Roelkens, M. Smit, and J. van der Tol, "*High-bandwidth uni-traveling carrier waveguide photodetector on an InP-membrane-on-silicon platform,*" Opt. Express 24, 8290-8301 (2016).

The extended optical cavity (resonator) 113, 123 of each of the first and second mode-locked laser 110, 120 comprises a passive waveguide structure for confining the transverse components of a light beam travelling forth and back in the optical cavity, and for guiding the light beam longitudinally along the extended optical cavity. The passive waveguide structure thus defines the transverse modes of the light beam in the optical cavity. Typically, the waveguide structure is configured to be single-mode, e.g. by combining a suitable waveguide geometry, material and cladding, but is not limited thereto. For instance, transverse multi-mode waveguide geometries are possible and may be combined with mode converters, mode adaptors, and/or mode filters, arranged within the optical cavity, to restore a single-mode regime where it proves advantageous. In general, care is taken, e.g. by suitable taper sections, to only excite the fundamental mode in a multi-mode waveguide geometry. For example, it is usually beneficial to arrange for transverse multi-mode waveguide geometries where the gain sections 111, 121 and/or saturable absorber sections 112, 122 are coupled to the respective optical cavities 113, 123. An excited fundamental mode propagating along a transverse multi-mode waveguide in the gain sections allows to increase the effective mode area of the fundamental mode, whereby the pulse peak fluence is lowered and the maximum pulse peak power before reaching gain saturation is increased. Wider transverse multi-mode waveguides in the gain sections and/or saturable absorber sections also allow for better alignment tolerances in respect of heterogeneously integrated epitaxial layer stacks. Besides, wider transverse multi-mode waveguides in the saturable absorber sections typically allow photogenerated charge carriers to be removed more efficiently and rapidly. A large portion of the waveguide structure being single-mode, the excited higher-order modes can be filtered out efficiently again. Yet, a multi-mode waveguiding regime may be beneficial in at least some other portions of the waveguide structure if this allows, for instance, to further reduce nonlinear absorption losses (e.g. multi-photon absorption effects, free carrier absorption) or a more flexible approach to the control of the intra-cavity dispersion properties.

In embodiments of the invention, a waveguide structure is generally formed in a waveguide layer of the substrate 101, using, for example, pulsed laser writing, or photolithography and etch techniques known in the art. Such a waveguide layer of the substrate is 101 is generally supported by a lower cladding layer that is optically transparent, e.g. silica or sapphire, and can have air as an upper cladding material or can be provided with an upper cladding layer, e.g. silica. Moreover, optically transparent insulating cladding layers, e.g. comprising a low-loss dielectric material as compared to doped semiconductor materials, have the advantage that waveguide propagation losses can be further reduced. A waveguide structure may thus be provided as a waveguide on the substrate 101, which supports and guides a plurality of longitudinal cavity modes in an extended spectral region (e.g. more than 100 longitudinal modes, e.g. more than 1000 longitudinal modes, spanning more than 3 nm, e.g. more than 10 nm in the optical domain), and preferably does so with as little optical losses as possible. In consequence, the waveguide is preferably formed in a material that has and a wide bandgap (e.g. above 2 eV at the center $\Gamma$ of the Brillouin zone) and low optical absorption losses, both linear and nonlinear, in the spectral region corresponding to the frequency comb generated by the mode-locked laser. Non-limiting examples of waveguide materials include silicon, silicon nitride, silicon carbide, gallium nitride, lithium niobite, tantalum oxide, ion-diffused glasses, chalcogenide glasses; waveguides formed in these materials can have less than 3 dB cm$^{-1}$ of optical propagation loss, e.g. less than 1 dB cm$^{-1}$ of optical propagation loss. It is an advantage of wide bandgap dielectric waveguide materials such as silicon nitride or silicon that, in comparison to narrow (direct) bandgap waveguide materials like InP, the wide bandgap dielectric waveguide materials have much less nonlinear multiphoton absorption and less free carrier related dispersion or absorption. Therefore, the circulating intracavity pulses are less distorted and also less absorbed in these preferred waveguide materials. In consequence, the gain sections of the corresponding mode-locked lasers can be shortened in length, which is beneficial in terms of the generated amount of amplified spontaneous emission (ASE) noise that negatively impacts the spectral purity of the generated frequency combs. Moreover, extended optical cavities using wide bandgap dielectric waveguide materials allow the implementation of heterogeneously integrated narrow linewidth master lasers on the same substrate, e.g. optical linewidths of 1 kHz can be achieved, whereas optical linewidths of lasers based on narrow (direct) bandgap waveguide materials like InP are much larger, e.g. at least of the order several hundreds of kilohertz.

Waveguide structures may comprise waveguides which may have straight and/or curved portions. As a matter of fact, a long optical cavity 113, 123, e.g. more than 1 cm, e.g. between 1 cm and 3 cm, or more than 3 cm long, may be obtained in a compact way (e.g. small footprint on the available substrate surface area) by folded or curled waveguide configurations, e.g. a spiral-forming waveguide portion. Various waveguide types exist for defining the passive waveguide structure, such as, but not limited thereto, ridge waveguides, rib waveguides, buried waveguides. Depending on the waveguide material and geometry, the passive waveguide structure of the extended optical cavity of one or both mode-locked lasers may be larger than 1.0 mm in physical length, e.g. larger than 3.0 mm, e.g. larger than 1 cm, e.g. between 1 cm and 3 cm, or even tens of centimeters long. In comparison thereto, a combined physical length of the active waveguide in the gain and saturable absorber sections of the mode-locked laser is typically about 1 mm.

Considering the example of an extended optical cavity based on a 400 nm thick and 37.0 mm long silicon waveguide (group index about 3.90) and a 1.0 mm long gain and saturable absorber section in a III-V material (group index about 3.95, matching well the group index of the silicon waveguide for efficient coupling) in a mode-locked laser with anti-colliding pulse topology, the total optical path length for one complete roundtrip of the pulse in the extended optical cavity is approximately 2*(37.0 mm*3.90+ 1.0 mm*3.95)=296.50 mm, corresponding to a comb spacing of about 1 GHz. In other example, the extended optical cavity of each ring resonator type mode-locked laser with symmetric configuration (colliding pulse topology) is based on a 200 mm long silicon nitride waveguide (group index about 2.00), whereas the combined length of gain and saturable absorber section in the III-V material (group index about 3.95) is much shorter and measures only 1.2 mm. This results in a total optical path length of about 404.74 mm with regard to one complete pulse roundtrip in the extended optical cavity and corresponds to a theoretical comb spacing of about 742 MHz (cavity roundtrip time ca. 1.35 ns). Experimentally, a comb spacing equal to 755 MHz has been measured for this particular example; the discrepancy with the theoretical value being caused by numerous effects including gain saturation, fabrication variations, and temperature effects.

The waveguide structure of the optical cavity does not have to be provided in a longitudinally uniform manner, but may comprise tapers between different waveguide widths, wider bents, and may additionally comprise passive optical elements like spot size converters, mode filters and/or adaptors, polarization rotators. In the present embodiment, for example, the waveguide of the extended optical cavity may comprise an interrupted and/or tapered section of smaller width where the gain section and/or saturable absorber section are provided, such that the guided optical modes associated with the longitudinal cavity modes are no longer supported and guided by the waveguide itself but are, instead, coupled into, and guided by, further waveguide structures which are provided in the gain section and/or absorber section. These tapered sections are preferably adapted for good mode coupling into, and out of, the further waveguide structures in the gain section and/or absorber section, whereby coupling losses as part of the optical cavity losses are reduced. Moreover, the tapered sections are preferably adapted for good mode coupling over a broad spectral region, e.g. the spectral width of the frequency comb emitted by each mode-locked laser. In embodiments of the invention, the mode transitions between the passive waveguide structure of the extended optical cavity and the active waveguide in the gain section, or gain section and saturable absorber section, may be obtained by means of vertical tapers, e.g. single-step, two-step or even multi-step vertical taper structures. For instance, mode transition from a silicon nitride passive waveguide of the extended optical cavity towards active waveguide in the gain region of the heterogeneously integrated layer stack of III-V material may involve a two-step taper structure, in which the mode first transitions from the silicon nitride waveguide into a further waveguide patterned into an intermediate layer of hydrogenated amorphous silicon, before transitioning once again from the further waveguide into the active waveguide in the gain region.

Optical feedback is provided by a reflector arrangement at both ends of the extended optical cavity 113, 123. First reflectors 114, 124 of the corresponding extended optical cavities 113, 123 are arranged so that their transmissive apertures act as the corresponding input ports 117, 127 of the mode-locked lasers 110, 120, and further so that their reflective apertures are optically connected to the waveguide structure of the extended optical cavities. For instance, the first reflectors 114, 124 may be provided as distributed Bragg reflectors (DBRs), e.g. as diffractive waveguide gratings formed in the waveguide structures, e.g. in the waveguide core itself and/or in a waveguide cladding adjacent to the core. Then, the reflective and transmissive apertures of the first reflector correspond to cross-sections of the waveguide structure at the beginning and the end of the grating respectively, with the beginning being located at the side of the extended optical cavity. Alternatively, a waveguide loop mirror or a partially reflective multi-mode interferometer (MMI) may be provided as first reflector 114 or 124. Similarly, second reflectors 115, 125 are provided at the opposite end of the respective extended optical cavities 113, 123 so that their reflective apertures are optically connected to the waveguide structure thereof. As described for the first reflectors 114, 124, also the second reflectors 115, 125 may each be provided as a DBR, e.g. diffractive waveguide grating, partially reflective MMI or waveguide loop mirror. Both first reflectors 114, 124 and second reflectors 115, 125 are broadband reflectors, e.g. their optical passband extends over at least 3 nm (e.g. over more than 5 nm, e.g. more than 10 nm), and their optical passband spectrally overlaps with the supported mode-locked longitudinal cavity modes of the first mode-locked laser 110 and the second mode-locked laser 120 respectively. A reflectance for the first reflectors 114, 124 may be about 90%, e.g. between 85% and 95%, which is a good trade-off between cavity mirror losses on the one hand and sufficient in-coupling efficiency for the injection locking laser line on the other hand. Experimental verification has shown that as little as one to five microwatts of injected optical power inside the extended cavity of the mode-locked lasers 110, 120 are sufficient to establish the wavelength locking of the generated frequency comb. Higher injected optical powers for the injection locking laser line can be used to extend the locking range, e.g. an extended locking range of up to 14 MHz has been demonstrated at 10 μW of injected optical power inside the cavity. Regarding the second reflectors 115, 125, a reflectance thereof may be in the range from 30% to 70%, e.g. about 50%. This lower reflectance as compared to the first reflectors ensures that the pulse train emitted by the mode-locked lasers 110, 120 comprises pulses with good peak power and/or pulse energy, e.g. pulse energies of the order of ~1 pJ and/or peak powers of the order of ~1 W for picosecond long pulses, but can be further increased by subsequent pulse compression.

At least one of the extended optical cavities 113, 123, e.g. both, may comprise a phase shifter (not shown) to actively tune, upon application of an electrical signal, the optical path length of the optical cavities 113, 123. For instance, heaters based on dissipative metal or doped silicon traces, or electro-refractive phase shifters based on the free carrier dispersion effect, constitute suitable choices for the implementation of intracavity phase shifters. Such phase shifters may be provided along the waveguide structure of the extended optical cavity and/or on the first or second reflector. Fine tuning the optical path length of the extended optical cavity by means of phase shifters has the additional advantage that a deviation from an intentional difference in optical path lengths between the extended optical cavity 113 of the first mode-locked laser 110 and the extended optical cavity 123 of the second mode-locked laser 120, which is typically caused by fabrication variability, can be corrected. This difference in optical path lengths translates naturally into a corresponding difference in pulse repetition rates between the frequency combs generated by the first and second mode-locked laser. An intentional difference in optical path lengths and corresponding repetition rates may be beneficial in dual comb spectroscopy applications for which a small offset in repetition rates is necessary to obtain a plurality of beat notes upon combination of the two frequency combs on a beat detection unit, e.g. on a photodetector. By way of example, a tuning range for the pulse repetition rate of about 50 kHz/K can be obtained with heaters as phase shifters and typical relative changes of each cavity length caused by fabrication variability may be about ±0.05%. Therefore, correction of the pulse repetition rate of at least one mode-locked laser 110, 120 in the range of approximately 1 MHz by heating of the waveguide structure up to a temperature difference of approximately 20 K is feasible, which corresponds to a maximally expected offset in repetition rates of the two generated frequency combs for a nominal repetition rate of 1 GHz as targeted by design, e.g. 2*0.05%*1 GHz=1 MHz. An intentional relative change in cavity lengths of the first and second mode-locked laser for the purpose of conducting dual comb spectroscopy measurements is preferably chosen larger than the unintentional deviations caused by fabrication, e.g. an intentionally introduced relative change in cavity lengths may be 0.2%.

An optical coupling element 105 may be part of the connection arrangement 102 for distributing the light supplied by the master laser 130 to each one of the first and second mode-locked laser 110, 120, e.g. by branching of a single output waveguide into at least two distinct delivery waveguides 103 and 104. The coupling element 105 may be configured for equally dividing an optical output power that is supplied by the master laser 130 into the distinct delivery waveguides 103, 104. However, a different coupling ratio may be provided with respect to the delivery waveguide coupled to the respective input port of the mode-locked lasers. For instance, a directional coupler (DC) or interference-based coupler (multi-mode interferometer MMI, Mach-Zehnder interferometer MZ), or combinations thereof may be used as coupling element 105. The coupling element 105 may comprise more than one optical component, e.g. may be implemented by a sequence or cascade of optical components suitable for achieving light coupling (e.g. MMI, MZ, DC, Y-junctions, X-junctions). A coupling ratio between the light supplied by the master laser 130 and the coupled light sent to the mode-locked lasers 110, 120 may be tunable, e.g. by electro-optic phase tuning of a waveguide portion of the coupling element such as, without being limited thereto, an outgoing waveguide portion of an X-junction or Y-junction, or a waveguide portion of a directional coupler or an interferometric component (inter-ferometer arm). A tunable coupling ratio has the advantage that a better control on the injected optical powers relative to each mode-locked laser can be achieved. This may matter, for instance, if propagation losses along the delivery wave-guides 103, 104 differ by a predetermined amount due to design asymmetries and/or because of the presence of fur-ther optical components along the waveguides, or if the two mode-locked lasers have different injection locking thresh-olds. Besides, the coupling element 105 may distribute light generated by the master laser 130 to more than just two delivery waveguides communicating with the mode-locked lasers 110, 120. A further waveguide may be receiving light coupled by the coupling element 105, e.g. for the purpose of tapping a portion of the master laser 130 light for monitor-ing, e.g. via an integrated or external photodetector coupled to the further waveguide.

Various other optical components may be provided as optional elements in light paths of the connection arrange-ment 102. In particular, a variable optical attenuator 106 can be inserted into the light path of an output waveguide connected to the master laser output port 136, for controlling an amount of optical output power delivered and injected into each mode-locked laser 110, 120. The variable optical attenuator may have attenuation ranges between 20 dB and 50 dB. In combination with a 10% transmittance of the first reflectors 114, 124, at least 30 dB of optical extinction can be achieved for the narrow laser line supplied by the master laser 130 for simultaneous injection locking of the two mode-locked lasers 110, 120. Hence, the master laser 130 can be advantageously operated in a regime where it delivers more than 1 mW, e.g. about 10 mW, of optical output power such that its RIN noise is strongly reduced and the associated laser linewidth is sufficiently narrow relative to the repeti-tion rate of the generated frequency combs, e.g. at least one permille of the repetition rate, e.g. <0.1‰ of the repetition rate. An attenuation by at least 30 dB then yields between 1 μW and 10 μW in the extended optical cavities of each mode-locked laser, which has been demonstrated to achieve good optical injection locking and phase coherence transfer between the injection line supplied by the master laser 130 and the comb lines of the generated frequency combs. To their great surprise the inventors found that no optical isolator had been necessary, neither in the connection arrangement 102, e.g. in the respective light paths extending between the master laser output port 136 and each mode-locked laser 110, 120, nor as part of the master laser 130 itself. Such an optical isolator is notoriously difficult to implement in a PIC but is usually strictly required in order to avoid that partially reflected light is coupled back into master laser 130 and disturbs its good functioning, in particular by importantly broadening its narrow linewidth, resulting in the loss of the optical injection lock and the transfer of phase coherence from the master laser to the mode-locked lasers. However, the inventors realized that the strong optical attenuation of more than 40 dB, e.g. more than 60 dB, e.g. between 60 dB and 120 dB, experienced by the partially reflected light, passing twice the attenuator 106, effectively protects the master laser 130 from any such disturbances and ensures a stable emission without spectral broadening of the narrow linewidth laser line for injection locking. Furthermore, the spectral filtering function intrinsic to a narrow bandwidth resonator of the master laser 130, or to a narrow bandwidth, external optical cavity coupled to the master laser output port 136, provides an efficient protection against the interference of pulses of the pulse trains, generated by the mode-locked lasers and re-injected into the master laser 130, with the narrow linewidth operation of the master laser 130. One way to implement a variable optical attenuator is to provide a waveguide-based interferometer in which one interferometer arm comprises a phase-shifter. Another way of implementing a variable optical attenuator consists in providing an electro-absorption device that is optically coupled to the output waveguide connected to the master laser output port 136, e.g. a pn-junction or pin-junction formed across the output waveguide via doping. Moreover, a frequency-shifter 107 can be provided in the light path of one of the delivery waveguides 103. This has the advantage that the injection-locked comb lines for the first and second mode-locked laser 110, 120 can be slightly offset, e.g. by a fraction of the repetition rate of the frequency combs, e.g. offset by a fraction between 1% and 1‰ of the repetition rate. The injection locking of the frequency combs can thus be performed with respect to a comb line that is located in a center portion of the frequency comb instead of a side portion, and aliasing artifacts in the beat notes are precluded or at least reduced. Possible frequency-shifter may be provided as integrated acousto-optic modulators (e.g. using surface acoustic waves) or phase shifters arranged in a single-sideband carrier suppressed configuration.

In the embodiment of FIG. 1, an optical combiner 108 is coupled to the second reflector 115, 125 of each mode-locked laser 110, 120, for combining the two frequency combs, generated by the first and second mode-locked laser, into an output 109 of the integrated dual frequency comb source 100. For instance, a broadband directional coupler or multi-mode interferometer can be used as combiner.

The master laser 130 is configured to generate a single continuous wave (cw) lasing line at its output port 136, the wavelength of which lies within the spectral range of supported and mode-locked longitudinal cavity modes of each of the two semiconductor mode-locked lasers 110, 120. The master laser 130 is further configured to generate the cw lasing line with a linewidth inferior to the frequency comb line spacings of both mode-locked lasers 110, 120, e.g. a linewidth of the cw lasing line is inferior to 1‰ of the repetition rate of the generated frequency combs, e.g. less than 1 MHz for a 1 GHz repetition rate for the generated frequency combs. Preferably, a linewidth of the cw lasing line is also inferior to the optical linewidth associated with the longitudinal cavity modes, e.g. below 100 kHz, e.g. about 10 kHz or less. In principle, any stable single-mode laser satisfying the aforementioned demands on the linewidth may be provided as master laser 130 on the same substrate 101 as the first and second mode-locked laser if it is capable of supplying optical output powers that are at least of the order of milliwatts or tens of milliwatts. In preferred embodiments of the invention, however, the master laser 130 comprises an extended optical cavity 133 that is formed in the same waveguide layer of the substrate 101 as the waveguide structures of the extended optical cavities 113, 123 of each of the mode-locked lasers 110, 120, and the optical path length of which is approximately equal to those of the cavities of the first and second mode-locked laser, e.g. differs therefrom by less than 1%. This has the advantage that the position of the longitudinal cavity modes in optical frequency space of the mode-locked lasers closely matches that of the master laser. As a result, the master laser 130 can deliver a narrow linewidth cw line for optical injection locking that lies within the locking range even at low injected optical powers (e.g. microwatts) inside the optical cavities of each mode-locked laser. In addition thereto, also frequency drifts, particularly thermal frequency drifts, are nearly equal for the longitudinal cavity mode generated by the master laser 130 and the locked longitudinal cavity mode of each of the first and second mode-locked laser 110, 120.

The master laser 130 is preferably a semiconductor laser, too. In the present embodiment, it comprises a gain section 131, and an extended optical cavity 133 with a high-reflectivity rear reflector 134 (e.g. fully reflective loop mirror or DBR) and a partially reflective front reflector 135, e.g. a partially reflective DBR or waveguide loop mirror. The gain section 131 may be an epitaxial material layer stack, e.g. an epitaxial III-V or II-VI layer stack, e.g. an epitaxial layer stack based on InP or CdSe/MgSe, which can be heterogeneously integrated into the PIC, e.g. by adhesive bonding, molecular bonding, or transfer printing of the layer stack onto the substrate 101. The gain section 131 of the master laser 130 may thus comprise the same gain material as the gain sections 111, 121 of the mode-locked lasers 110, 120, but is not limited thereto. Alternative embodiments may, for instance, provide a hybrid integrated master laser, e.g. a semiconductor laser comprising or consisting of a monolithic epitaxial layer stack of III-V of II-VI composite material, which is die-bonded to the substrate. In yet alternative embodiments, the master laser may be formed directly on the substrate and may comprise strained, or strained and doped germanium. In contrast to the extended optical cavities 113, 123 of the mode-locked lasers 110, 120, the reflectors 134, 135 of the extended optical cavity 133 of the master laser preferably have a narrow optical bandwidth adapted for single-mode selection. If the reflector arrangement of the extended optical cavity 133 of the master laser 130 is not selective for single-mode operation, an external optical bandpass filter that allows the selection of only one lasing mode of the master laser 130 can be provided as part of the connection arrangement 102 and coupled to the master laser output port 136.

The first and second mode-locked lasers 110, 120 are configured for passive mode locking, which has the advantage of not requiring additional RF circuitry. This may be obtained by providing separate electrical contacts for the gain section and the saturable absorber section for supplying a forward current and a reverse bias voltage respectively. Preferably, electrical isolation barriers are provided between contacts for the gain section and the absorber section to reduce cross-talk. However, some embodiments of the invention may also support hybrid mode-locking if the PIC is complemented with further external RF circuitry for generating an oscillating electrical reference signal for stabilization of the repetition rates, e.g. hybrid mode-locking is supported by including an RF trace for delivering the reference signal to contact electrodes of the saturable absorber sections 112, 122.

Preferably, the mode-locked lasers 110, 120 are arranged according to an anti-colliding pulse configuration. To this end, the saturable absorber section 112, 122 is positioned relative to the extended optical cavity 113, 123 such that is located closer to, or at least partially above, the low-reflectivity second reflector 115, 125 as compared to the high-reflectivity first reflector 114, 124. Anti-colliding configurations have the benefit of achieving higher output power, lower timing jitter and improved RF spectral purity as compared to a colliding pulse configuration. Moreover, an extended optical cavity arranged in an anti-colliding pulse configuration guarantees that a single circulating pulse is obtained in the cavity. A further advantage of the anti-colliding pulse configuration is that the laser line for injection locking supplied by the master laser is injected into the optical cavity 113, 123 at the side adjacent to the gain section 111, 121 instead of the saturable absorber section 112, 122. This has the effect that the injected laser line for locking is subsequently amplified in the gain medium and modulates the gain more efficiently as compared to an injection at the side adjacent to the saturable absorber section 112, 122. Therefore, lower optical powers for injection locking can be obtained and back-reflections into the master laser 130 are less severe.

Nonetheless, other embodiments of the invention may have the mode-locked lasers arranged according to a colliding pulse configuration, e.g. a symmetric configuration, in which the saturable absorber sections are positioned centrally relative to the respective extended optical cavities. Moreover, in mode-locked lasers according to the symmetric configuration, a separate gain section is typically provided on each side of the centrally located saturable absorber section, e.g. the symmetrically configured mode-locked lasers display a three-sectioned heterogeneously integrated III-V material-based active region, in which the saturable absorber region constitutes the central section that is flanked by two lateral, electrically isolated gain sections. This symmetric configuration can be applied to extended optical cavities of the linear type as well as of the ring resonator type.

Performance characteristics of a frequency combs generated by exemplary heterogeneously integrated III-V on SOI mode-locked lasers according to embodiments of the invention include a frequency comb spectral width of at least 12 nm (e.g. measured as the 10 dB width), more than 1000 comb lines, e.g. more than 1400 comb lines, separated by a 1 GHz line spacing. The comb lines have good spectral purity, a good peak signal-to-noise ratio (SNR) with respect to the noise floor and a low-frequency range of the RF spectrum associated with the comb, below the fundamental tone, is clean. For example, a fundamental tone in the corresponding RF spectrum of the comb may have less than 100 kHz spectral 10-dB linewidth (e.g. less than 10 kHz, e.g. below 1 kHz spectral 10-dB linewidth) and more than 50 dB peak SNR, which provides evidence of stable mode locking with little pulse intensity noise and timing jitter. Exemplary heterogeneously integrated, epitaxial InP-based layer stacks on SOI mode-locked lasers may consume as little as 140 mW during operation. More generally, embodiments of the invention may provide semiconductor mode-locked lasers 110, 120 for which a length of the extended optical cavity 113, 123 corresponds to pulse repetition rates below 20 GHz in the generated frequency comb, e.g. below 10 GHz, e.g. less than 5 GHz, e.g. about 1 GHz or less. A linewidth in the RF spectrum associated with the frequency comb, i.e. the detection of beat notes in the RF domain, is preferably less than 1 MHz, e.g. less than 100 kHz, e.g. less than 10 kHz, e.g. 1 kHz or less, e.g. sub-Hz region. An optical bandwidth of a generated frequency comb spectrum may be larger than 100 GHz, e.g. lager than 300 GHz, e.g. larger than 1 THz. The comb spectrum may be flat-top and may comprise more than 100, e.g. up to 1000 and more, e.g. more than 1400, comb lines for spectroscopy. Here, a frequency comb spectrum is considered to be flat-top over its optical bandwidth if the amplitude variations (e.g. the peak spectral power density) of the comb lines spanning the comb do not vary by more than 3 dB about a constant top level. An optical linewidth of each comb line, when integrated over a 5 µs time interval, is generally below 5 MHz, e.g. less than 1 MHz, e.g. less than 500 kHz, e.g. 100 kHz or less. To obtain mode-locking by optical injection-locking, however, it is sufficient that only the one comb line of each mode-locked laser that is locked to the cw lasing line of the master laser (with or without an additional frequency shift being applied) has an optical linewidth below 5 MHz, e.g. less than 1 MHz, e.g. less than 500 kHz, e.g. 100 kHz or less. The one comb line of each mode-locked laser that is to be locked, may correspond to the comb line which has the smallest linewidth across the entire comb, e.g. the comb line which is closest to a frequency fixpoint related to the dominant noise source. In general, the optical linewidth associated with a comb line increases quadratically with the mode number n, starting with the smallest linewidth comb line as n=0.

Although the embodiment of FIG. 1 relates to linear resonators for the two mode-locked lasers, these may also be provided as ring lasers operated in the pulsed regime when mode-locked. For ring laser configurations, the extended optical cavity of the first and second mode-locked laser comprises a closed-loop waveguide structure without reflectors. An output waveguide is optically coupled to the closed-loop waveguide structure, e.g. via a directional coupler or MMI arranged within the closed-loop waveguide structure, for coupling out the generated frequency combs. The saturable absorber section of each mode-locked laser may then be interposed between two gain sections, in accordance with a colliding pulse configuration, e.g. the saturable absorber section is arranged half-way within the extended optical cavity relative to the coupling section with the output waveguide. The master laser may be coupled to one end of each of the output waveguides for the first and second mode-locked laser, whereas the opposite end portion of the same output waveguides directs the generated frequency combs to the outputs of the PIC, e.g. to cleaved facts which may be antireflection coated.

In operation, the gain sections 111, 121 of the first and second mode-locked lasers 110, 120 respectively are supplied with a forward current exceeding the laser threshold current, e.g. forward bias currents between 60 and 120 mA may be supplied to each mode-locked laser of the III-V on SOI type. Further, a reverse bias voltage is applied across the saturable absorber sections 112, 122 of the respective mode-locked lasers 110, 120, e.g. a reverse bias voltage bias between −2 V and −3 V for each mode-locked laser of the III-V (e.g. InP-based) on SOI type. The selected forward currents and reverse bias voltages are such that each one of the two semiconductor mode-locked lasers 110, 120 spontaneously switches to the mode-locked regime. As the supplied forward currents and reverse bias voltages are only comprising a DC component, passive mode-locking is achieved. However, particular embodiments of the invention may additionally arrange for a RF component that is added, e.g. via a bias tee, to the DC component of either the forward current (current modulation) or the reverse bias voltage (absorption modulation) of at least one of the mode-locked lasers 110, 120 to enable hybrid mode-locking. Such an RF signal may be synthesized from a 10 MHz hydrogen maser reference signal for achieving direct referencing of the repetition rates of the frequency combs generated by the first and second mode-locked laser to a frequency standard. Hybrid mode-locking has the advantage of further stabilizing the repetition rates of the generated frequency combs and of producing narrower RF linewidths upon detection of the beat notes. The master laser 130 is also supplied with an electrical current above laser threshold to start emitting a narrow cw laser line, which is then injected into the extended optical cavities 113, 123 of the two mode-locked lasers 110, 120 to achieve injection-locking and thus mutual coherence of the two mode-locked lasers 110, 120. Preferably, the first and second mode-locked laser are first set into the pulsed lasing mode before optical injection-locking is performed. Since the phase coherence and wavelength of the cw lasing line generated by the master laser 130 is transferred to each of the mode-locked lasers 110, 120, a simultaneous stabilization of the carrier offset frequency and mutual coherence of the two generated frequency combs is achieved. At least one of the semiconductor mode-locked lasers 110, 120 may also be locked to higher harmonics, that is more than one circulating pulse is established in the corresponding extended optical cavity 113, 123, which leads to increased pulse repetition rates for the emitted frequency comb. Higher repetition rates may be useful in optical telecommunication applications or LIDAR. This can be accomplished without compromising the good spectral purity of the beat tones in the RF spectrum associated with the frequency comb, e.g. spectral linewidths of a few kHz are possible.

Optionally, the optical power injected into each mode-locked laser may be adjusted, e.g. using at least one variable optical attenuator that can be part of the connection arrangement 102 as described hereinabove for embodiments of the invention. Further, the optical power injected into each mode-locked laser may be adjusted by tuning a coupling ratio of a tunable coupling element that can be part of the connection arrangement 102 as described hereinabove for embodiments of the invention. The wavelength of the narrow cw laser line for injection-locking, emitted by the master laser 130, may be frequency-shifted with respect to only one of the two mode-locked lasers, e.g. using a frequency shifter 107 in one of the delivery waveguides 103, 104. This has the advantage that those two comb lines in the generated, mutually coherent frequency combs that are injected-locked to the cw laser line of the master laser 130 do not coincide, i.e. do not have the same wavelength. As a result thereof, the left-right degeneracy that exists in the beat note interferogram for two mutually coherent and aligned frequency combs upon heterodyne detection is now lifted because of the intentionally introduced misalignment of the two injection-locked comb modes. Consequently, more beat notes can be detected unambiguously in dual comb spectroscopy applications, which allows for a broader spectral sensing range. Even for two frequency combs that have been locked at a comb line located in a side portion of the respective combs, the amount of aliasing obtained upon detection of the beat notes can be further reduced if a frequency shifter is used.

In other embodiments of the invention, separate frequency shifters may be arranged in each one of the delivery waveguides 103, 104, or alternatively, in only one of the delivery waveguides and in a waveguide portion of the connection arrangement that is common to the delivery paths of cw lasing light to the first and second mode-locked laser, e.g. the single output waveguide that is connected between the output port 136 of the master laser and the coupling element 105. In such embodiments one of the frequency shifters can be used to achieve better spectral alignment of the cw lasing line emitted by the master laser with the resonant mode of one of the mode-locked lasers, whereas the other one frequency shifter serves the purpose of controlling the detuning of induvial the comb lines composing the first frequency comb relative to the comb lines composing the second frequency comb, by injecting and frequency-locking the resonant mode of the other one of the mode-locked lasers. In yet other embodiments, a single frequency shifter may be arranged in a waveguide portion of the connection arrangement that is common to the delivery paths of cw lasing light to the first and second mode-locked laser, e.g. the single output waveguide that is connected between the output port 136 of the master laser and the coupling element 105. As mentioned before, this has the advantage that better spectral alignment of the cw lasing line emitted by the master laser with a resonant mode of one or both mode-locked lasers can be achieved. This may be of particular interest in embodiments in which the cw lasing line emitted by the master laser is not tunable. Besides, an actuator may be provided as part of a feedback loop, in which the actuator is configured to receive information regarding the drift of a generated frequency comb and to adjust a control signal for setting the frequency shift of the frequency shifter accordingly. This can further improve the long-term stability of the dual frequency comb source.

Figure 2:
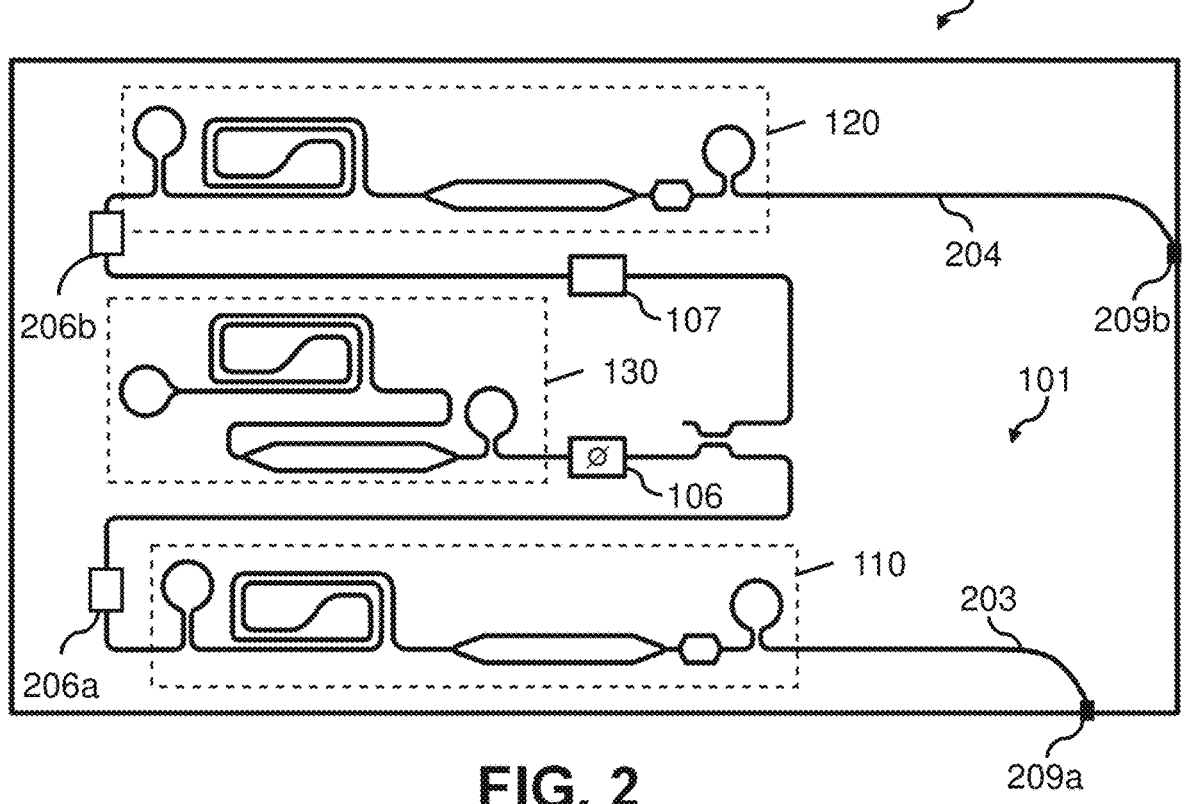
FIG. 2 shows a photonic integrated circuit-based dual frequency comb source according to a second embodiment of the invention, in which each one of the two mutually coherent frequency combs is supplied by two distinct output of the source.

FIG. 2 shows a second embodiment of an integrated dual frequency comb source 200. This embodiment differs from the previous one in that the outputs of the first and second mode-locked laser 110, 120 are not coupled together via an output combiner. Instead, output waveguides 203, 204 are connected between a respective one of the two mode-locked lasers 110, 120 and a corresponding output 209a, 209b of the dual frequency comb source 200. This has the advantage that the two generated frequency combs can be accessed independently from one another. The output waveguides 203, 204 may be sloped with respect to an output facet or cleaving face of the dual frequency comb source 200 provided as a PIC. This has the benefit of reducing spurious reflections and preventing undesirable optical feedback from re-entering the extended optical cavities of the mode-locked lasers 110, 120. Hence, spurious pulse trains can be suppressed. In an alternative of this embodiment, a cleaved facet of the PIC may be used as second reflector of the extended cavity of at least one of the mode-locked lasers 110, 120 and this cleaved facet also acts as corresponding output 209a, 209b of the dual frequency comb source 200. For such an alternative no output waveguide is required between the mode-locked laser and the respective output of the dual frequency comb source, whereby propagation losses can be reduced and an outcoupling efficiency improved. Moreover, two individual variable optical attenuators 206a and 206b are inserted into the respective light paths connecting the master laser 130 with each one of the mode-locked lasers 110, 120. This has the advantage that differences in the required optical injection powers or locking ranges, caused by fabrication variability, can be compensated for each mode-locked laser 110, 120 individually. The additional attenuators 206a, 206b may be used to lower the minimum extinction ratio of the attenuator 106 closest to the master laser 130, or to replace it by a non-variable attenuator, compared to the case of only having the single attenuator 106. In an alternative of the present embodiment, the common attenuator 106 closest to the master laser 130 may be entirely omitted.

The insertion of additional attenuators 206a, 206b is not restricted to the present embodiment and the above-mentioned modifications may be applied to other embodiments of the invention, too. Although less preferred due to the higher propagation losses, embodiments of the present invention can be implemented in a generic InP-based platform, e.g. as a monolithically integrated PIC in InP-based materials, using active-passive integration.

Figure 3:
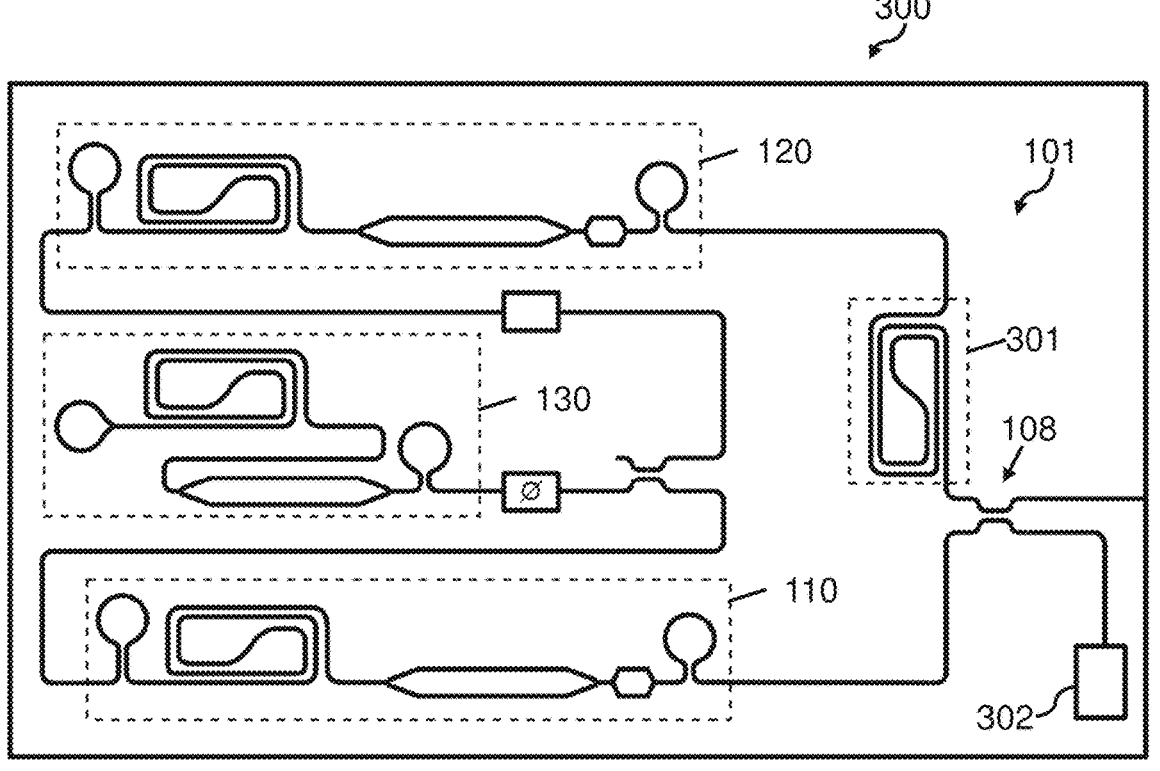
FIG. 3 shows a photonic integrated circuit implementing a system for dual frequency comb spectroscopy according to an embodiment of the invention, the system comprising an integrated dual frequency comb source according to the first embodiment of FIG. 1.

FIG. 3 shows an integrated system for dual frequency comb spectroscopy 300. Such a system can be used for absorption spectroscopy of gasses. The system 300 comprises a dual frequency comb source as described hereinabove for the first embodiment of FIG. 1. The first and second generated frequency combs have slightly differing repetition rates, e.g. by intentionally differing optical path lengths of the corresponding optical cavities 113, 123, e.g. by choosing a relative difference of less than 1% in the optical cavity lengths of the first and second mode-locked laser 110, 120, as previously described with respect to embodiments of the invention. In addition thereto, the system 300 also comprises a sensing area 301 in which one of the generated frequency combs interacts with surrounding gas molecules and a balanced photodetector 302. The sensing are 301, for example, comprises a curled waveguide portion, e.g. a spiral, along which surrounding gas molecules interact with the evanescent tail of the guided train of pulses. As a result of the interaction between the gas molecules and the frequency comb used for sensing, the comb lines that overlap with spectral absorption features of the gas molecules decrease in intensity. The combiner 108 combines the modified frequency comb for sensing with the reference frequency comb that is prevented from interacting with the gas molecules. Upon detection on the balanced photodetector 302, connected to an output of the combiner 108, an interferogram of beat notes is created that can be recorded and analyzed in the RF domain, e.g. by an RF spectrum analyzer electrically connected with an output of the photodetector 302. A signal processing means, e.g. a microprocessor that can be co-integrated with the system 300, then determines the Fourier transform of the interferogram to reconstruct the absorption spectrum in the RF domain, which can be referenced back to the optical domain. This referencing to the optical domain is achieved by comparing the injection-locked comb line to a predetermined reference wavelength, e.g. obtained from calibration measurements, and by controlling the temperature of the integrated spectroscopy system within tight bounds to avoid mode hopping in the master laser, e.g. controlling temperatures within ±0.1 K. The predetermined reference wavelength may be the calibrated wavelength of the cw lasing line of the master laser 130 which has been compared to a wavelength standard, e.g. to a molecular absorption line of a gas like acetylene. Alternatively, the cw lasing line generated by the master laser 130 may be tracked or stabilized relative to a wavelength reference, e.g. a molecular absorption line of a gas like acetylene, by tapping out a fraction of the optical power of the cw lasing line generated by the master laser, injecting it into a gas cell, and detecting a relative change in transmittance representative of the wavelength drift. The gas cell may be provided on-chip, e.g. integrated into the PIC, or may be provided off-chip.

The broad and dense frequency combs generated by the first and second mode-locked laser 110, 120, e.g. more than 1000 comb lines spaced about 1 GHz apart, allow to resolve the collision-broadened rovibrational absorption features of gasses under atmospheric pressure. As the two frequency combs are mutually coherent by injection-locking and their comb lines drift by the same amount (corresponding to the drift of the injection lasing line of the master laser 130), no further stabilization mechanism is required to enable fast parallel broadband molecular spectroscopy. It is another advantage of embodiments of the invention that the spectroscopic measurement can be performed without requiring scanning of either one of the two generated frequency combs.

Other integrated dual frequency comb spectroscopy systems are possible, in which the sensing area 301 is not provided on the substrate 101 itself but in which a light path for sensing extends into surrounding space instead, and/or in which a light path for sensing extends in external device, e.g. a single-pass or multi-pass gas cell, which is coupled to input and output ports of the system 300. Besides, the detection of beat notes and the recording of an interferogram may be also be done on an external photodetector, using for example a complementary output of the combiner 108.

Figure 4:
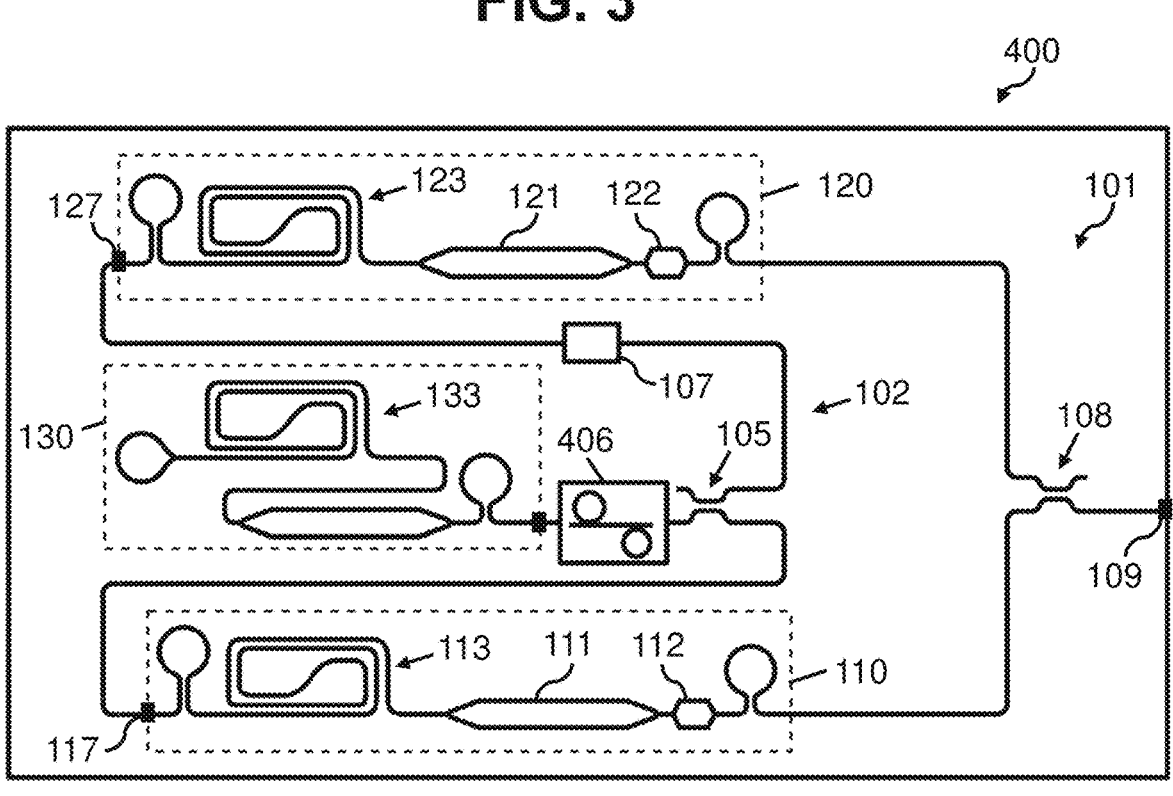
FIG. 4 is a variant of the photonic integrated circuit-based dual frequency comb source relating to FIG. 1, in which the variable optical attenuator on the light path of the connection arrangement has been rep

With reference to FIG. 4, a photonic integrated circuit-based dual frequency comb source 400 is shown, which is a variant of the dual frequency comb source 100 described in respect of FIG. 1. Photonic integrated circuit-based dual frequency comb source 400 differs from dual frequency comb source 100 of FIG. 1 in that the variable optical attenuator 106 has been replaced by an optical filter of the Vernier type 406. This Vernier-type optical filter 406 may be implemented as two microring resonators connected in series, wherein the respective free spectral ranges of the two microring resonators are slightly mismatched to obtain a combined free spectral range of the Vernier-type filter 406 that is a multiple of both microring resonator free spectral ranges (Vernier effect). The combined free spectral range of the Vernier-type filter 406 can exceed the individual free spectral ranges of the microring resonators by an order of magnitude and values between 500 GHz up to a few THz (e.g. 2-3 THz) for the combined free spectral range are readily obtainable. Other implementations of the Vernier-type optical filter 406 are possible as well, e.g. cascaded interferometers such as cascaded Mach-Zehnder interferometers. In operation, a transmittance feature (e.g. peak) of the Vernier-type optical filter 406, which may be tunable in wavelength, is spectrally aligned with the wavelength of the cw laser line emitted by the master laser 130. This may also be achieved by designing the Vernier-type optical filter so that its transmittance feature (e.g. peak) matches the wavelength of the emitted cw laser line, by wavelength-tuning the master laser 130, by frequency-shifting the cw laser line emitted by the master laser with a frequency shifter of the connection arrangement, inserted between the master laser output port and the Vernier-type optical filter, or by a combination thereof. Similar to the variable optical attenuator 106, the Vernier-type optical filter 406 can be inserted into the light path of an output waveguide connected to the master laser output port 136, to obtain strong optical attenuation of backpropagating light that is readmitted into the master laser 130. Backpropagating light that is attenuated relates primarily to the comb lines of the frequency combs generated by the first and second mode-locked laser 110, 120 and transmitted through the respective ports 117, 127; but it may also encompass the partially reflected and frequency-shifted cw laser light in embodiments that provide one or more frequency shifters 107 as part of the connection arrangement 102. This effectively protects the master laser 130 from disturbances caused by the operation of mode-locked laser 110, 120 and ensures a stable emission without spectral broadening of the narrow linewidth laser line for injection locking. With regard to the Vernier-type optical filter 406, strong optical attenuation can be defined as the extinction ratio that is measurable from its transmittance profile. Practically achievable extinction ratios may be at least 25 dB, e.g. between 25 dB and 60 dB. Although an optical attenuator is not part of the connection arrangement 102 of the present embodiment, it is possible to combine the Vernier-type optical filter 406 with the use of one or more optical attenuators, which may be variable, in the light path of the same connection arrangement, e.g. as set forth in embodiments relating to FIG. 1 or FIG. 2.

Figures 5, 6:
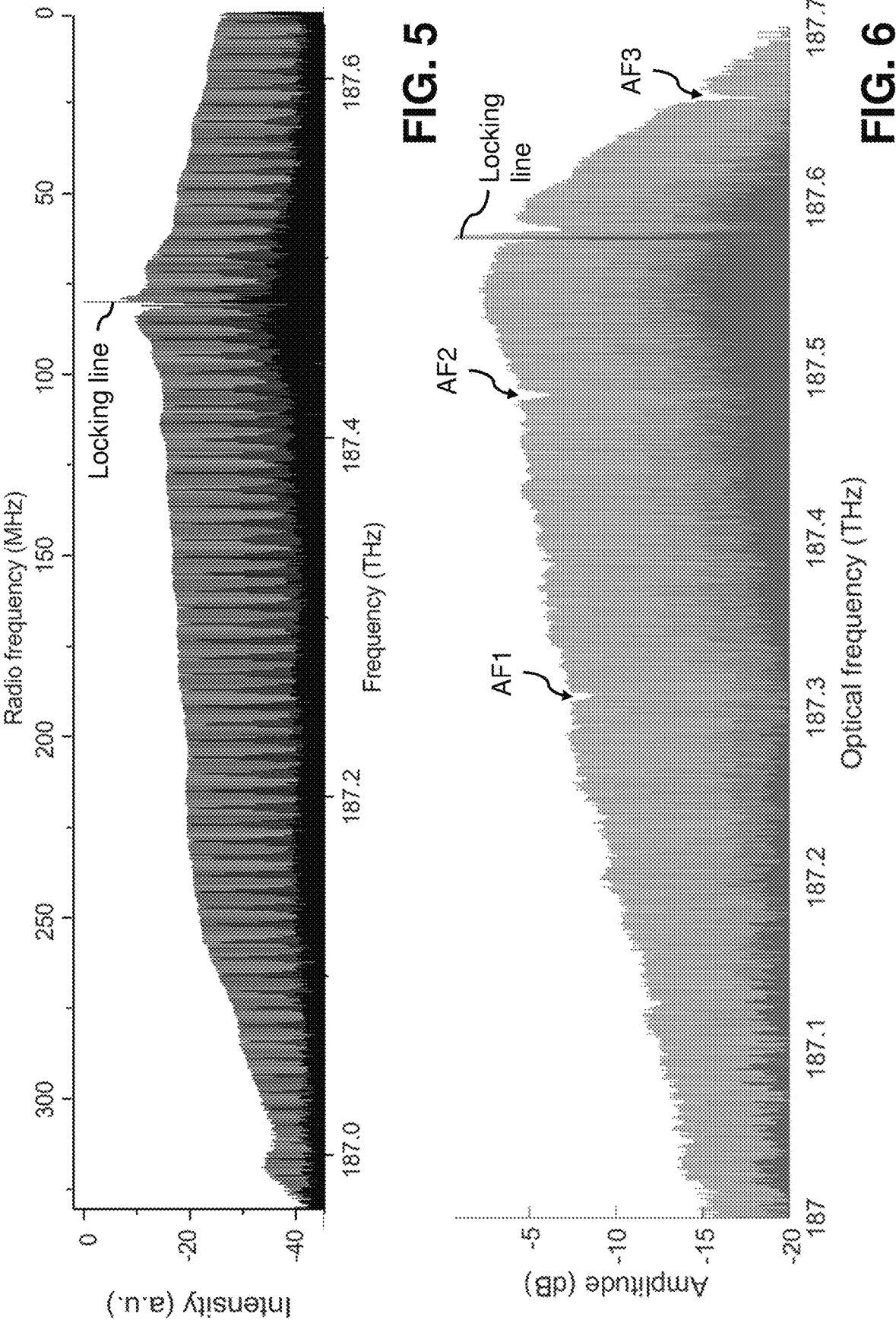
FIG. 5 is a recorded spectrum corresponding to one of the frequency combs generated by an integrated dual frequency comb source according to an embodiment of the invention.
FIG. 6 is a recorded dual frequency comb absorption spectrum obtained by sending one of the generated frequency combs of the source through a sample gas cell, using a dual frequency comb spectroscopy system in accordance with embodiments of the invention.

FIG. 5 shows part of a recorded spectrum (approximately 50%) of the frequency comb emitted by one of the semiconductor mode-locked lasers of an integrated dual frequency comb source in accordance with an embodiment of the invention. The semiconductor mode-locked lasers are provided as heterogeneously integrated III-V on SOI laser (e.g. 400 nm thick silicon), comprising a 700 μm long gain section with six InP/InGaAsP quantum wells in the active layer and an extended optical cavity based on a passive silicon waveguide (e.g. 2 cm to 4 cm long) or silicon nitride waveguide (e.g. 4 cm to 8 cm long). The spectrum has been obtained by measuring the beat notes in the RF domain produced by optical heterodyne detection upon combining the frequency comb emitted by the mode-locked laser with an externally generated electro-optical (EO) frequency comb on a balanced photodetector. Here, the EO frequency comb acts as an array of local oscillators for down-conversion to the RF domain. The same cw lasing line of the master laser that has been used for injection-locking of the mode-locked lasers also served as carrier and seed line in the EO frequency comb generator, e.g. an intensity modulator coupled to a highly nonlinear optical fiber, the line spacing of which has been set slightly different from the repetition rate of the semiconductor mode-locked laser frequency comb, e.g. set to a 0.5 MHz difference in comb line spacings. This ensures that the two frequency combs, i.e. the frequency combs generated by the semiconductor mode-locked laser and the EO comb generator, are mutually coherent. Then the spectrum is recovered from the measured beat notes (averaged interferogram of 1200 sequential, 100 μs long acquisitions) by applying a Fourier transform, followed by a translation back to optical frequencies. Here, the intense beat note between the injection-locked mode of the emitted frequency comb, tied to the lasing line for injection-locking as generated by the master laser, and the carrier wavelength of the externally generated EO frequency comb is used as a landmark for translating back the recorded RF spectrum to the optical domain. Inspection of the recorded spectrum reveals that the frequency comb, limited by the spectral coverage of the externally generated EO frequency comb (e.g. 50% overlap with the frequency comb generated by the mode-locked laser) counts 660 comb lines spanning 666 GHz. The spectrum further demonstrates that the frequency comb generated by the mode-locked laser is smooth and flat-top. The pulse repetition rate according to the comb line spacing is approximately 1.01 GHz. The full spectrum of the frequency comb generated by the mode-locked laser is even broader; it spans 1.17 THz, is flat-top, and contains 1154 comb lines.

The invention also relates to a method of performing dual frequency comb spectroscopy on a sample comprising a species to be sensed. A species for sensing may be a gas molecule at atmospheric pressure or higher than atmospheric pressure. The method comprises the step of providing an integrated dual frequency comb source according to an embodiment described hereinabove, and a sensing area for light-matter interaction between the species to be sensed and one of the frequency combs generated by the integrated dual frequency comb source. The sensing area may be comprised by the integrated dual frequency comb source, e.g. provided in a light path of only one of the first and second generated frequency combs, or may be external to the integrated dual frequency comb source, e.g. an absorption cell or free-space region. Next, the first and second mode-locked laser are injection-locked to a lasing wavelength supplied by the master laser. In a further step, the sample is brought in contact with the sensing area to provide light-matter interaction between the species and a first one of the two frequency combs generated by the integrated dual frequency comb source, the second one serving as a reference frequency comb. Thereafter, an interferogram comprising a plurality of beat lines is recorded upon detection of a combination of the first and second frequency comb.

FIG. 6 illustrates confirmed absorption features AF1 to AF3 and the cw locking line on a dual comb spectroscopy record. A dual frequency comb interferometer system for spectroscopy has been used, which comprises a photonic integrated circuit-based dual frequency comb source similar to the one shown in FIG. 2, an external sensing area, and an external photodetector for the recording of the beat lines in the time-domain interferogram. The external sensing area corresponds to a CO-filled absorption gas cell. The spectral record has been generated by averaging 90 μs long time slices over a total acquisition time of 17.5 ms, followed by an inverse Fourier transform and a translation back to the optical frequency domain. More than 700 spectral lines, e.g. up to 800 spectral lines or more, can be distinguished. In the dual frequency comb spectroscopy experiment, the cw laser line for injection-locking had a wavelength 1598.00 nm, the repetition rate difference of the two mode-locked lasers had been set to 253 kHz, and a frequency shift of 75 MHz had been applied by the frequency shifter to the cw laser line in one branch of the connection arrangement. The frequency spacing between adjacent comb lines of each of the two generated frequency combs was about 1.01 GHz, which also equals the resolution achieved with the dual-comb interferometer in that experiment, and a Lorentzian fit to lines of the corresponding RF spectra were demonstrated to have a FWHM of less than 20 Hz, at 100 Hz resolution bandwidth.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The invention claimed is:

1. A photonic integrated circuit-based mutually coherent dual frequency comb source comprising, on a same substrate of the photonic integrated circuit, a first and a second mode-locked laser for generating a first and second frequency comb respectively, each of the first and second mode-locked laser including a gain section and a saturable absorber section to provide mode-locking, and an extended optical cavity having a passive waveguide structure formed in a waveguide layer of the substrate, wherein at least said gain sections are provided as layered stacks of heterogeneously integrated III-V material, bonded to said substrate, a master laser for generating a continuous wave lasing line for simultaneous optical injection-locking of the first and second mode-locked laser, the master laser being configured to generate said continuous wave lasing line with a linewidth narrower than a frequency spacing between modes of the first and second frequency comb, and a connection arrangement, interposed between an output port of the master laser and a respective input port of each of the first and second mode-locked laser, for coherently transferring lasing light generated by the master laser to each mode-locked laser.

2. The dual frequency-comb source according to claim 1, wherein the extended optical cavity of each of the first and second mode-locked laser is arranged as a linear optical resonator or as a ring resonator.

3. The dual frequency comb source according to claim 1, wherein the master laser comprises an extended optical cavity formed in the same waveguide layer of the substrate as the waveguide structures of the extended optical cavities of each of the mode-locked lasers.

4. The dual frequency comb source according to claim 3, wherein an optical path length of the master laser extended optical cavity differs from a corresponding optical path length of any one of the mode-locked lasers extended optical cavities by less than 1%.

5. The dual frequency-comb source according to claim 1, wherein the connection arrangement comprises a coupling element in optical communication with the output port of the master laser and at least two delivery waveguides optically connected between the coupling element and the input ports of the first and second mode-locked laser.

6. The dual frequency comb source according to claim 1, wherein the gain section of each one of the first and second mode-locked laser is configured for electrical bias current injection, and/or wherein the saturable absorber section of at least one of the first and second mode-locked laser is configured for receiving a radiofrequency signal, modulated at a rate corresponding to a frequency spacing between adjacent comb lines frequency comb generated by that mode-locked laser.

7. The dual frequency comb source according to claim 1, wherein the gain section and the saturable absorber section of at least one of the first and second mode-locked laser are made from a different semiconductor material, or wherein the gain section and the saturable absorber section of at least one of the first and second mode-locked laser are formed in the same heterogeneously integrated III-V material, bonded to said substrate.

8. The dual frequency comb source according to claim 1, wherein each of the first and second mode-locked laser comprises a corresponding first reflector arranged at the input port, a reflectance value of the first reflectors being from 85% to 95%.

9. The dual frequency comb source according to claim 1, wherein the connection arrangement further comprises at least one frequency shifter arranged between the output port of the master laser and the input port of at least one of the first and second mode-locked laser.

10. The dual frequency comb source according to claim 1, wherein the connection arrangement is devoid of any optical isolator.

11. The dual frequency comb source according to claim 1, wherein the connection arrangement further comprises at least one optical attenuator to control an amount of optical power that is injected into each of the first and second mode-locked laser.

12. The dual frequency comb source according to claim 1, wherein at least one of the first and second mode-locked laser is configured for generating a frequency comb with less than ten gigahertz comb spacing.

13. The dual frequency comb source according to claim 1, wherein the passive waveguide structure of the extended optical cavity of at least one of the first and second mode-locked laser has a physical length greater than 1.0 mm.

14. The dual frequency comb source according to claim 1, wherein the connection arrangement further comprises a Vernier-type optical filter.

15. The dual frequency comb source according to claim 1, wherein each resonant mode of each extended optical cavity has a spectral bandwidth below 5 MHz at 5 us integration time.

16. An integrated system for dual frequency comb spectroscopy, comprising:

a photonic integrated circuit-based dual frequency comb source according to claim 1, a photodetector arranged to receive the combined frequency combs of the first and second mode-locked laser, a sensing area provided in a light path extending between only one of the first and second mode-locked laser and the photodetector, said sensing area being configured for allowing light-matter interaction between a generated frequency comb and a species to be sensed, wherein a difference in comb spacing of the generated first and second frequency comb is comprised in a detectable radiofrequency range of the photodetector.

17. The system according to claim 16, wherein the sensing area comprises a waveguide portion configured for evanescent wave sensing between said generated frequency comb, guided by said waveguide portion, and said species to be sensed.

18. The system according to claim 16, further comprising processing means for detecting and analysing beat lines in an interferogram produced by the photodetector, in response to interference of received first and second frequency combs.

19. The system according to claim 16, wherein the system is provided as a photonic integrated circuit.

20. A method of performing dual frequency comb spectroscopy on a sample comprising a species to be sensed, comprising:

providing a photonic integrated circuit-based dual frequency comb source according to claim 1, wherein a repetition rate of a first generated frequency comb differs from a repetition rate of a second generated frequency comb, coherently transferring continuous wave lasing light generated by the master laser from an output port of the master laser to a respective input port of each of the first and second mode-locked laser, thereby optically injection-locking the first and second mode-locked laser to a wavelength of said continuous wave lasing light, directing the first generated frequency comb through a sensing area, said sensing area being configured for receiving the species to be sensed and for allowing light-matter interaction between the frequency comb and said species, contacting the sample with the sensing area, detecting beat notes in an interferogram generated upon superimposition of the first and second generated frequency comb on a photodetector, the first generated frequency comb having interacted with the species in the sample.

* * * * *